(12) United States Patent
Cheon et al.

(10) Patent No.: US 10,931,254 B2
(45) Date of Patent: Feb. 23, 2021

(54) FRONT END MODULE

(71) Applicant: SAMSUNG ELECTRO-MECHANICS CO., LTD., Suwon-si (KR)

(72) Inventors: Seong Jong Cheon, Suwon-si (KR); Hyung Jin Lee, Suwon-si (KR); Jeong Hae Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/434,473

(22) Filed: Jun. 7, 2019

(65) Prior Publication Data

US 2020/0169240 A1    May 28, 2020

(30) Foreign Application Priority Data

Nov. 23, 2018  (KR) .......................... 10-2018-0145911

(51) Int. Cl.
| | |
|---|---|
| *H01P 1/10* | (2006.01) |
| *H03H 7/01* | (2006.01) |
| *H04B 1/10* | (2006.01) |
| *H03H 7/46* | (2006.01) |
| *H03H 7/075* | (2006.01) |

(52) U.S. Cl.
CPC .......... *H03H 7/465* (2013.01); *H03H 7/0115* (2013.01); *H03H 7/075* (2013.01); *H03H 7/1725* (2013.01); *H03H 2007/013* (2013.01)

(58) Field of Classification Search
CPC ........ H01P 1/10; H03H 7/175; H03H 7/1758; H03H 7/1766; H04B 2001/1063

USPC .................................................. 333/101, 175
See application file for complete search history.

(56) References Cited

U.S. PATENT DOCUMENTS

| | | | | | |
|---|---|---|---|---|---|
| 5,256,997 | A  * | 10/1993 | Inagaki | ................... | H03H 7/06 333/167 |
| 5,697,087 | A  * | 12/1997 | Miya | ........................ | H03D 7/18 333/204 |
| 5,774,027 | A  * | 6/1998 | Yamamoto | ............... | H03H 7/01 333/167 |
| 8,014,373 | B2 * | 9/2011 | Malak | .................... | H01Q 1/007 370/339 |
| 8,018,304 | B2 * | 9/2011 | Jian | ........................ | H04B 1/123 333/189 |
| 8,269,577 | B2 * | 9/2012 | Inoue | .................... | H03H 9/547 333/133 |
| 9,583,806 | B2 * | 2/2017 | Cho | ........................ | H01P 1/208 |
| 10,484,211 | B2 * | 11/2019 | Rogers | ..................... | H04B 1/10 |
| 10,840,887 | B2 * | 11/2020 | Schmalzl | ........... | H03H 11/1291 |

(Continued)

FOREIGN PATENT DOCUMENTS

| | | |
|---|---|---|
| JP | 5075188 B2 | 11/2012 |
| KR | 10-0902296 B1 | 6/2009 |

*Primary Examiner* — Dean O Takaoka
(74) *Attorney, Agent, or Firm* — NSIP Law

(57) ABSTRACT

A front end module includes a base filter configured to operate as a bandpass filter passing a pass band of an input radio frequency signal; a switch connected to the base filter, and a first notch filter and a second notch filter selectively connected to the base filter through the switch, wherein a stop band of the first notch filter and a stop band of the second notch filter overlap the pass band of the base filter in a band equal to or higher than a center frequency of the pass band of the base filter.

18 Claims, 6 Drawing Sheets

(56) References Cited

U.S. PATENT DOCUMENTS

| | | | |
|---|---|---|---|
| 2013/0077540 A1* | 3/2013 | Black | H04B 1/109 370/277 |
| 2013/0154868 A1* | 6/2013 | Kehrer | H04B 1/1036 342/16 |
| 2014/0313947 A1* | 10/2014 | Ali-Ahmad | H04B 1/525 370/278 |
| 2018/0278442 A1* | 9/2018 | Rogers | H04B 1/1027 |
| 2019/0305803 A1* | 10/2019 | Winiecki | H04B 1/48 |
| 2019/0334563 A1* | 10/2019 | Elbrecht | H04B 1/0057 |

\* cited by examiner

FRONT END MODULE

CROSS-REFERENCE TO RELATED APPLICATIONS

This application claims the benefit under 35 USC 119(a) of Korean Patent Application No. 10-2018-0145911 filed on Nov. 23, 2018 in the Korean Intellectual Property Office, the entire disclosure of which is incorporated by reference for all purposes.

BACKGROUND

1. Field

The following description relates to a front end module.

2. Description of Related Art 5G mobile communications have been developed to use a frequency band between 28 and 29 GHz, a millimeter wave (mmWave), and a frequency band of 5 GHz, which is a type of a sub-6 GHz band. Among frequency bands used in 5G mobile communications, the bands between n1 and n76 and between n80 and n86 have also been used in long term evolution (LTE) communications. These overlapping band ranges may be supported using a surface acoustic wave (SAW) filter or a bulk acoustic wave (BAW) filter that support LTE communications. However, the bands of n77, between 3.3 and 4.2 GHz, n78, between 3.3 and 3.8 GHz, and n79, between 4.4 and 5.0 GHz, have broader bandwidths than bandwidths used in LTE communications. However, these band ranges may not be supported by only using a conventional SAW filter or a BAW filter.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a front end module includes a base filter configured to operate as a bandpass filter passing a pass band of an input radio frequency signal, a switch connected to the base filter, and a first notch filter and a second notch filter selectively connected to the base filter through the switch, wherein a stop band of the first notch filter and a stop band of the second notch filter overlap the pass band of the base filter in a band equal to or higher than a center frequency of the pass band of the base filter.

The stop band of the first notch filter may be the same as the stop band of the second notch filter.

A pass band of a radio frequency signal output from the first notch filter may be different from a pass band of a radio frequency signal output from the second notch filter.

The base filter may include at least one parallel LC resonance circuit disposed on a series end between an input terminal and an output terminal, and at least one series LC resonance circuit disposed on a shunt end between the series end and a ground.

The first notch filter may include a parallel LC resonance circuit disposed on a series end between an input terminal and an output terminal.

The second notch filter may include at least one resonator disposed on a series end between an input terminal and an output terminal, and an LC resonance circuit disposed on a shunt end between the series end and a ground.

The at least one resonator may include either one or both of a surface acoustic wave (SAW) resonator and a bulk acoustic wave (BAW) resonator.

In another general aspect, a front end module includes a base filter configured to operate as a pass band filter passing a pass band of an input signal, a switch connected to the base filter, and a first notch filter and a second notch filter selectively connected to the base filter through the switch, wherein an amount of attenuation of the first notch filter is different from an amount of attenuation of the second notch filter.

The amount of attenuation of the second notch filter may be greater than the amount of attenuation of the first notch filter.

A stop band of the first notch filter and a stop band of the second notch filter may overlap the pass band of the base filter.

A stop band of the first notch filter may be the same as a stop band of the second notch filter.

A pass band of a radio frequency signal output from the first notch filter may be different from a pass band of a radio frequency signal output from the second notch filter.

The base filter may include at least one parallel LC resonance circuit disposed on a series end between an input terminal and an output terminal, and at least one series LC resonance circuit may be disposed on a shunt end between the series end and a ground.

The first notch filter may include a parallel LC resonance circuit disposed on a series end between an input terminal and an output terminal.

The second notch filter may include at least one resonator disposed on a series end between an input terminal and an output terminal, and an LC resonance circuit disposed on a shunt end between the series end and a ground.

The at least one resonator may include either one or both of a surface acoustic wave (SAW) resonator and a bulk acoustic wave (BAW) resonator.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
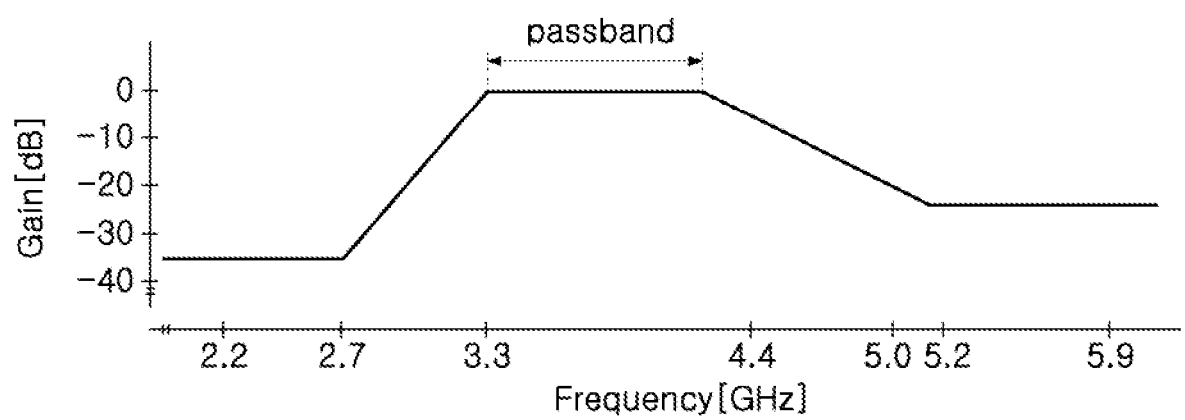
FIG. 1A and FIG. 1B are graphs illustrating frequency responses in bands n77, between 3.3 and 4.2 GHz, n78, between 3.3 and 3.8 GHz, and n79, between 4.4 and 5.0 GHz.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

An aspect of the present disclosure is to provide a front end module including a filter having high performance bandwidth properties and improved attenuation properties.

Figure 1B:
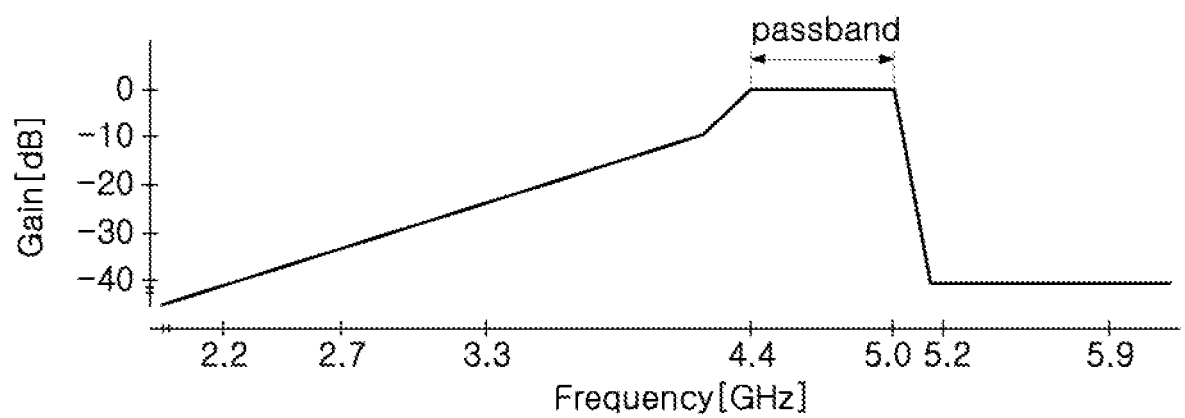

FIGS. 1A and 1B are graphs illustrating frequency responses in bands n77, between 3.3 and 4.2 GHz, n78, between 3.3 and 3.8 GHz, and n79, between 4.4 and 5.0 GHz.

FIG. 1A illustrates frequency responses in the bands n77, between 3.3 and 4.2 GHz, and n78, between 3.3 and 3.8 GHz, and FIG. 1B illustrates a frequency response in the band n79, between 4.4 and 5.0 GHz.

In the bands n77, between 3.3 and 4.2 GHz, n78, between 3.3 and 3.8 GHz, and n79, between 4.4 and 5.0 GHz, attenuation properties may need to be secured for carrier aggregation (CA) with LTE communication bands, as well as co-existence with Wi-Fi communications bands.

Referring to FIGS. 1A and 1B, in bands n77, between 3.3 and 4.2 GHz, n78, between 3.3 and 3.8 GHz, and n79, between 4.4 and 5.0 GHz, 30 dB or higher of attenuation may be required to be secured in 2.69 GHz or lower for successful carrier aggregation with LTE communication bands, and the attenuation properties may be successfully implemented by using an integrated passive device (IPD) filter or a ceramic filter.

However, referring to the example of FIG. 1A, in the bands n77, between 3.3 and 4.2 GHz, and n78, between 3.3 and 3.8 GHz, 20 dB or higher of attenuation may be required to be secured between 5.18 and 5.85 GHz for successful co-existence with 5 GHz Wi-Fi communications. An SAW filter and a BAW filter have a relatively narrow frequency gap between a resonance frequency and an anti-resonance frequency. Accordingly, attenuation properties between adjacent bands may be excellent, but it may be difficult to form a broad pass band. Therefore, it may be difficult to apply an SAW filter and a BAW filter to the bands n77, between 3.3 and 4.2 GHz, and n78, between 3.3 and 3.8 GHz.

Also, referring to the example of FIG. 1B, in the band n79, between 4.4 and 5.0 GHz, 35 to 40 dB or higher of attenuation may be required to be secured between 18 and 5.85 GHz for successful co-existence with 5 GHz Wi-Fi communications. However, it may be difficult to achieve such secured attenuation properties and also simultaneously provide 1.5 dB of insertion loss in a pass band by simply using an IPD filter or a ceramic filter. Also, as in the bands n77, between 3.3 and 4.2 GHz, and n78, between 3.3 and 3.8 GHz, because an SAW filter and a BAW filter have a relatively narrow frequency gap between a resonance frequency and an anti-resonance frequency, attenuation properties between adjacent bands may be excellent, but it may be difficult to form a broad pass band. Therefore, it may be difficult to successfully apply an SAW filter and a BAW filter to band n79, between 4.4 and 5.0 GHz.

Figure 2:
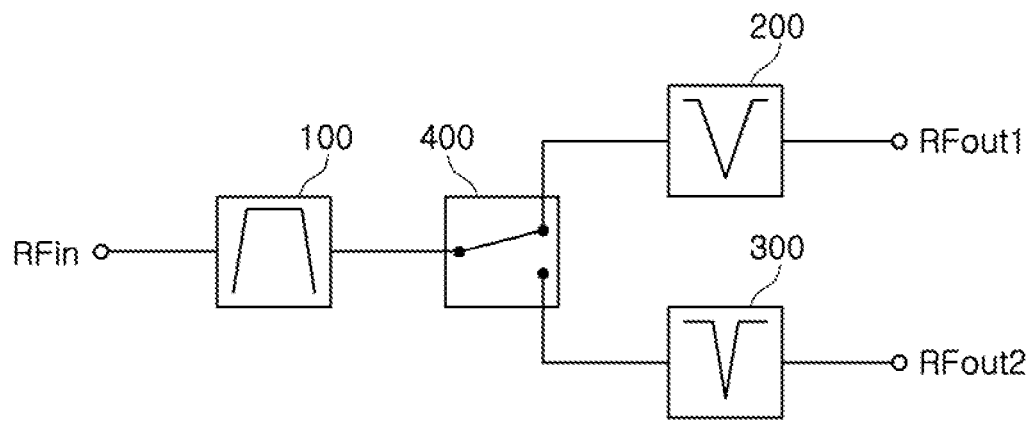
FIG. 2 is a block diagram illustrating a front end module according to an example.

FIG. 2 is a block diagram illustrating a front end module according to an example.

Referring to the example of FIG. 2, a front end module in the example may include a base filter 100, a first notch filter 200, a second notch filter 300, and a switch 400 selectively connecting one of the first notch filter 200 and the second notch filter 300 to the base filter 100.

One end of the base filter 100 may be connected to a signal input terminal RFin, and the other end may be connected to the switch 400. A radio frequency signal may be input into the signal input terminal RFin connected to the base filter 100. By virtue of being structured in this manner, the base filter 100 may operate as a bandpass filter passing a predetermined band.

A radio frequency signal including a first frequency band and a second frequency band may be input into the signal input terminal RFin. As an example, the first frequency band may be the bands n77, between 3.3 and 4.2 GHz, and n78, between 3.3 and 3.8 GHz, and the second frequency band may be the band n79, between 4.4 and 5.0 GHz.

The base filter 100 may attenuate an input radio frequency signal by 30 dB or higher at 2.69 GHz or lower for carrier aggregation (CA) between the bands n77, between 3.3 and 4.2 GHz, n78, between 3.3 and 3.8 GHz, and n79, between 4.4 and 5.0 GHz, as well as LTE communication bands. The base filter 100 may attenuate an input radio frequency signal by 30 dB or higher at 6.3 GHz or higher. Thus, the base filter 100 may have a pass band of between 2.69 GHz and 6.3 GHz for an input radio frequency signal. The base filter 100 may resolve insertion loss within pass bands of the bands n77, between 3.3 and 4.2 GHz, n78, between 3.3 and 3.8 GHz, and n79, between 4.4 and 5.0 GHz.

Figure 3:
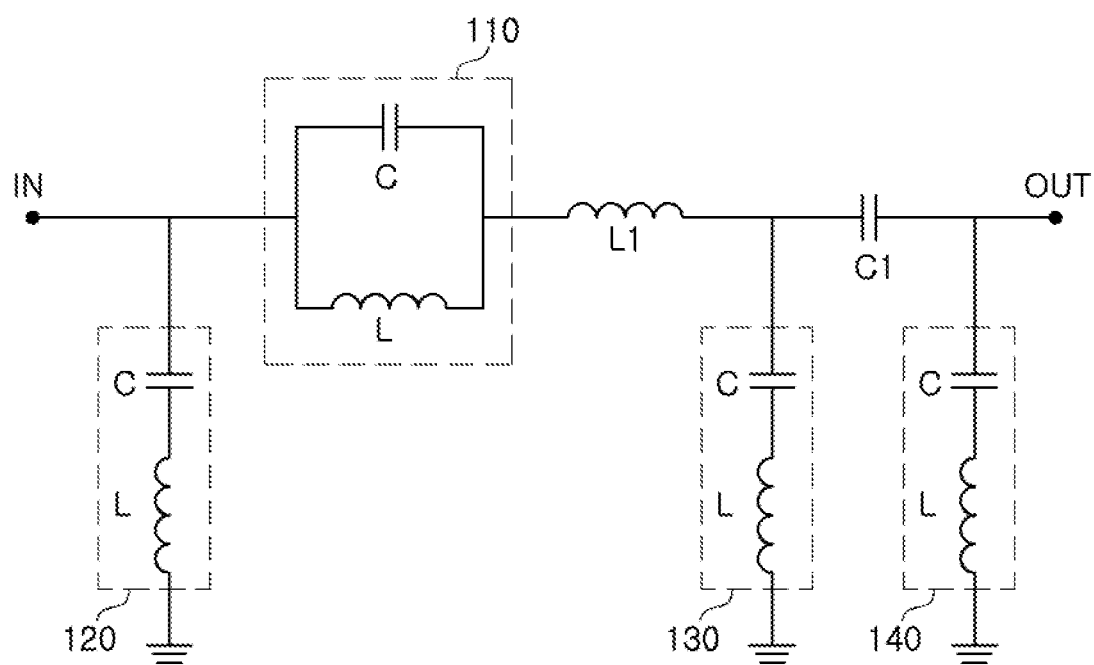
FIG. 3 is a circuit diagram of a base filter according to an example.
Figure 4:
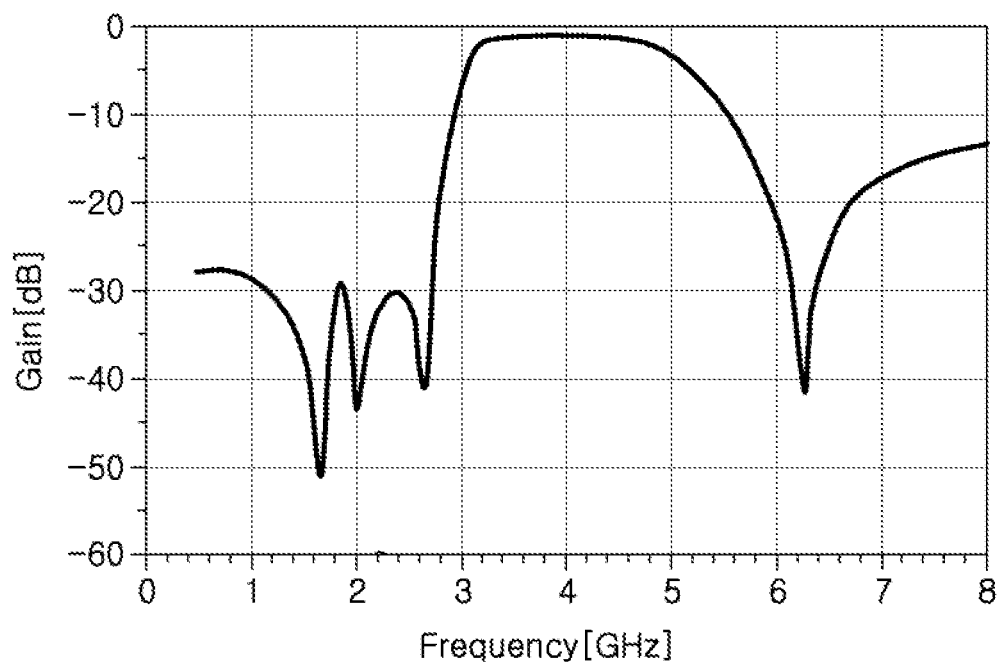
FIG. 4 is a graph illustrating a frequency response obtained by using a base filter according to an example.

FIG. 3 is a circuit diagram of a base filter according to an example. FIG. 4 is a graph illustrating a frequency response obtained by using a base filter according to an example.

Referring to the example of FIG. 3, a base filter 100 may include at least one parallel LC resonance circuit disposed on a series end between an input terminal and an output terminal, and at least one series LC resonance circuit disposed on a shunt end between the series end and a ground.

For example, the base filter 100 may include a parallel LC resonance circuit 110, a first inductor L1, and a first capacitor C1, which are disposed between an input terminal IN and an output terminal OUT, a first series LC resonance circuit 120 disposed between the input terminal IN and a ground, a second series LC resonance circuit 130 disposed between a node between the first inductor L1 and first capacitor C1, and a ground, and a third series LC resonance circuit 140 disposed between the output terminal OUT and a ground.

The parallel LC resonance circuit 110 may include an inductor and a capacitor connected in parallel, and the first series LC resonance circuit 120, the second series LC resonance circuit 130, and the third series LC resonance circuit 140 each may include an inductor and a capacitor connected in series.

The parallel LC resonance circuit 110, the first series LC resonance circuit 120, the second series LC resonance circuit 130, and the third series LC resonance circuit 140 may form a transmission zero, where a transmission zero is a frequency at which a transfer function has zero transmission, and may form a plurality of attenuation bands as illustrated in the example of FIG. 4. Thus, the base filter 100 may attenuate an input radio frequency signal by 30 dB or more at 2.69 GHz or lower, and may accordingly successfully perform carrier aggregation with LTE communication bands.

The first inductor L1 and the first capacitor C1 may match impedances of the parallel LC resonance circuit 110, the first series LC resonance circuit 120, the second series LC resonance circuit 130, and the third series LC resonance circuit 140 of the base filter 100.

Referring back to the example of FIG. 2, the first notch filter 200 may be selectively connected to the base filter 100 via the switch 400.

The first notch filter 200 may form at least one attenuation pole. When the first notch filter 200 is connected to the base filter 100, via the switch 400, the first notch filter 200 may attenuate a radio frequency signal input from the base filter 100 by using at least one attenuation pole. Accordingly, the first notch filter 200 may output a radio frequency signal of the band n78, between 3.3 and 3.8 GHz, the first frequency band, into a first signal output terminal RFout1.

In examples, a low noise amplifier may be connected to the first signal output terminal RFout1, and the low noise amplifier may amplify a radio frequency signal output into the first signal output terminal RFout1.

A stop band of the first notch filter 200 may overlap a pass band of the base filter 100. A stop band of the first notch filter 200 may be positioned in a relatively high band, equal to or higher than a center frequency of a pass band of the base filter 100. As an example, a stop band of the first notch filter 200 may be configured to be between 5.18 and 5.85 GHz, and may overlap a pass band of between 2.69 GHz and 6.3 GHz of the base filter 100.

The first notch filter 200 may include an LC filter. The first notch filter 200, including an LC filter, may attenuate a radio frequency signal input into the first notch filter 200 by 20 dB or more in the band between 5.18 and 5.85 GHz, and carrier aggregation with LTE communications may be accordingly be successfully implemented.

Figure 5:
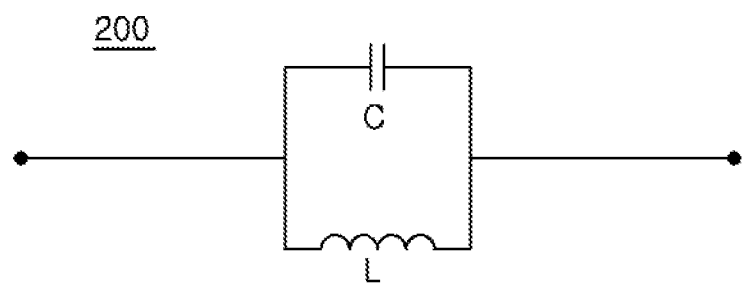
FIG. 5 is a circuit diagram of a first notch filter according to an example.
Figure 6:
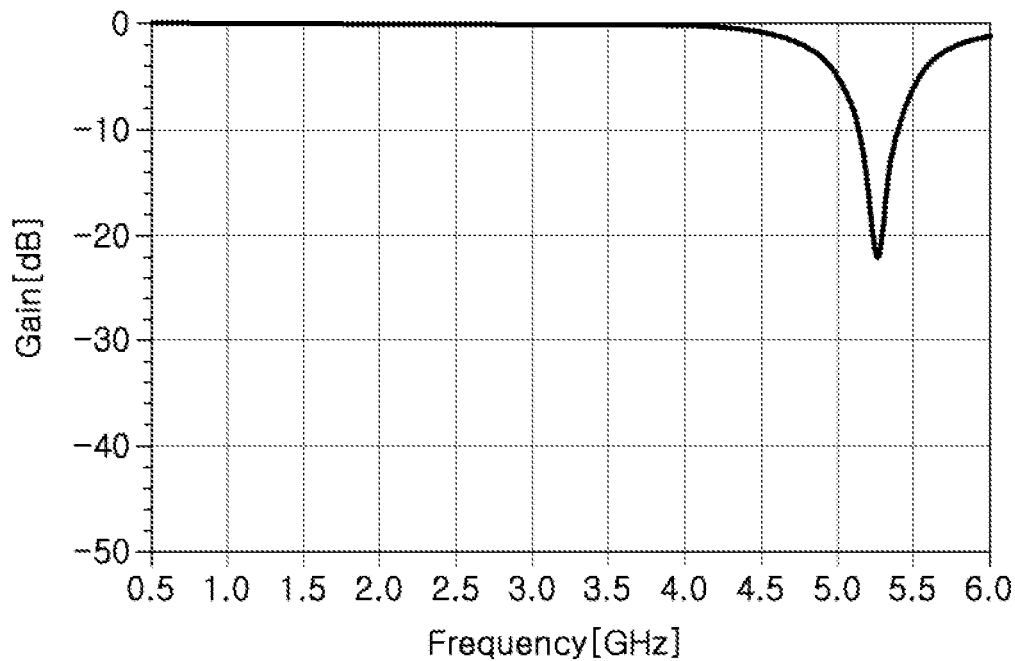
FIG. 6 is a graph illustrating a frequency response obtained by using a first notch filter according to an example.
Figure 7:
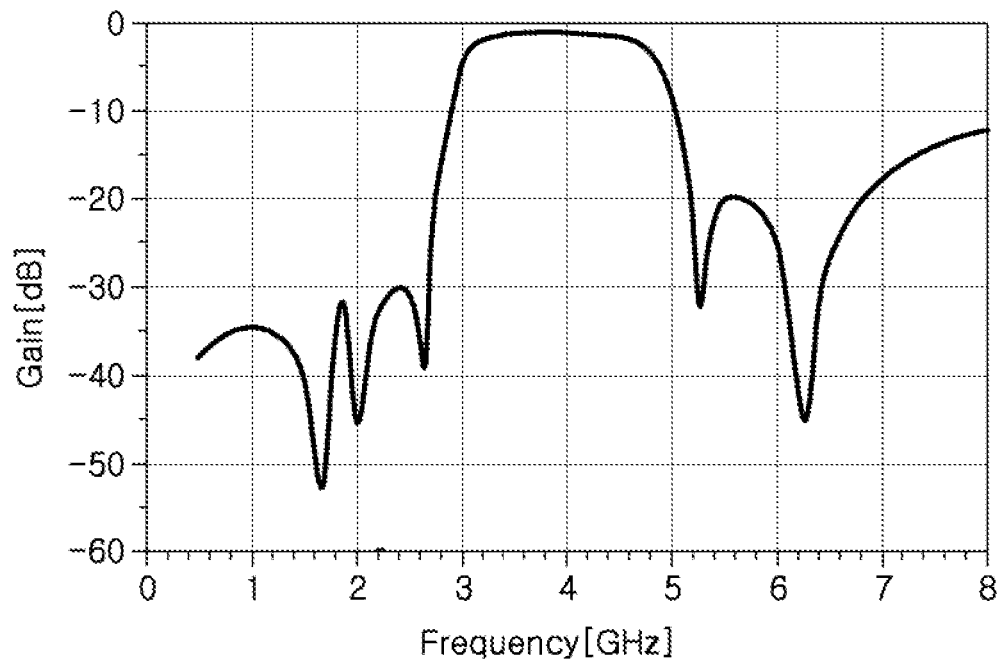
FIG. 7 is a graph illustrating a frequency response obtained by using a combination of a base filter and a first notch filter according to an example.

FIG. 5 is a circuit diagram of a first notch filter according to an example. FIG. 6 is a graph illustrating a frequency response obtained by using a first notch filter according to an example. FIG. 7 is a graph illustrating a frequency response obtained by using a combination of a base filter and a first notch filter according to an example.

Referring to the example of FIG. 5, the first notch filter 200 may include a parallel LC resonance circuit including an inductor L and a capacitor C connected in parallel between an input terminal IN and an output terminal OUT. The inductor L and the capacitor C connected in parallel may implement improved attenuation properties, as compared to an inductor L and a capacitor C connected in series.

A resonance frequency of the inductor L and the capacitor C connected in parallel may be configured to be lower than a center frequency of 5 GHz Wi-Fi communications. For example, a resonance frequency of the inductor L and the capacitor C may be 95% of a center frequency of 5 GHz Wi-Fi communications. Referring to the example of FIG. 6, a resonance frequency of the inductor L and the capacitor C may be 5.27 GHz, as shown in the graph.

When a frequency response obtained by using a combination of the base filter and the first notch filter, as illustrated in FIG. 7, is compared to a frequency response obtained by using the base filter illustrated in FIG. 4, due to a resonance frequency of the first notch filter, a frequency response obtained by using a combination of the base filter and the first notch filter illustrated in FIG. 7 may be attenuated at around 5.27 GHz, as compared to a frequency response obtained by using the base filter as illustrated in the example of FIG. 4.

Referring back to the example of FIG. 2, the second notch filter 300 may be connected to the base filter 100 via the switch 400. Accordingly, the second notch filter 300 may form at least one attenuation pole.

When the second notch filter 300 is connected to the base filter 100, a radio frequency signal input from the base filter 100 may be attenuated by at least one attenuation pole, as discussed further above, and the second notch filter 300 may output a radio frequency signal of the band n79, between 4.4 and 5.0 GHz, a second frequency band, into a second signal output terminal RFout2.

In examples, a low noise amplifier may be connected to the second signal output terminal RFout2, and the low noise amplifier may accordingly amplify a radio frequency signal output from the second signal output terminal RFout2. The low noise amplifier connected to the second signal output terminal RFout2 may be different from the low noise amplifier connected to the first signal output terminal RFout1, or in another example the low noise amplifier connected to the second signal output terminal RFout2 may be the same as the low noise amplifier connected to the first signal output terminal RFout1.

A stop band of the second notch filter 300 may overlap a pass band of the base filter 100. For example, a stop band of the second notch filter 300 may be positioned at a relatively high band, higher than a center frequency of a pass band of the base filter 100. As an example, a stop band of the second notch filter 300 may be configured to be between 5.18 and 5.85 GHz, and may overlap a pass band of between 2.69 GHz and 6.3 GHz of the base filter 100.

The second notch filter 300 may include at least one of an SAW filter and a BAW filter. The second notch filter 300 including at least one of an SAW filter and a BAW filter may attenuate a radio frequency signal input into the second notch filter 300 by 35 to 40 dB or more in the band between 5.18 and 5.85 GHz, and co-existence with 5 GHz Wi-Fi communications may be implemented as a result.

Between the band n79, between 4.4 and 5.0 GHz, the second frequency band, and the band of between 5.18 and 5.85 GHz of 5 GHz Wi-Fi communications, a relatively extremely small gap, being a difference of 180 MHz, may be present. As a result, sufficient attenuation properties may not be secured by only using a single LC notch filter. When filters of a plurality of LC notch filters are applied to secure attenuation of 35 to 40 dB or higher in the band between 5.18 and 5.85 GHz, insertion loss properties may degrade as a result.

An SAW filter and a BAW filter may include a resonance frequency and an anti-resonance frequency. When a filter is designed using an SAW filter and a BAW filter, a resonator may be connected to a series end between an input terminal and an output terminal, or may be connected to a shunt end between a series end and a ground. In the resonator disposed on the series end, a resonance frequency may be formed in a lower frequency band than an anti-resonance frequency. Thus, the resonator disposed on the series end may be suitable for a filter, of which a pass band has a lower frequency than a frequency of a stop band. Also, in the resonator disposed on the shunt end, a resonance frequency may be formed in a higher frequency band than an anti-resonance frequency, so the resonator disposed on the shunt end may be suitable for a filter, of which a pass band has a higher frequency than a frequency of a stop band.

In the second notch filter in the example, in order to secure attenuation of 35 to 40 dB or more in the band of between 5.18 and 5.85 GHz, which is higher than the band n79, between 4.4 and 5.0 GHz, the second frequency band, an SAW filter and a BAW filter may be disposed on the series end, accordingly.

Figure 8:
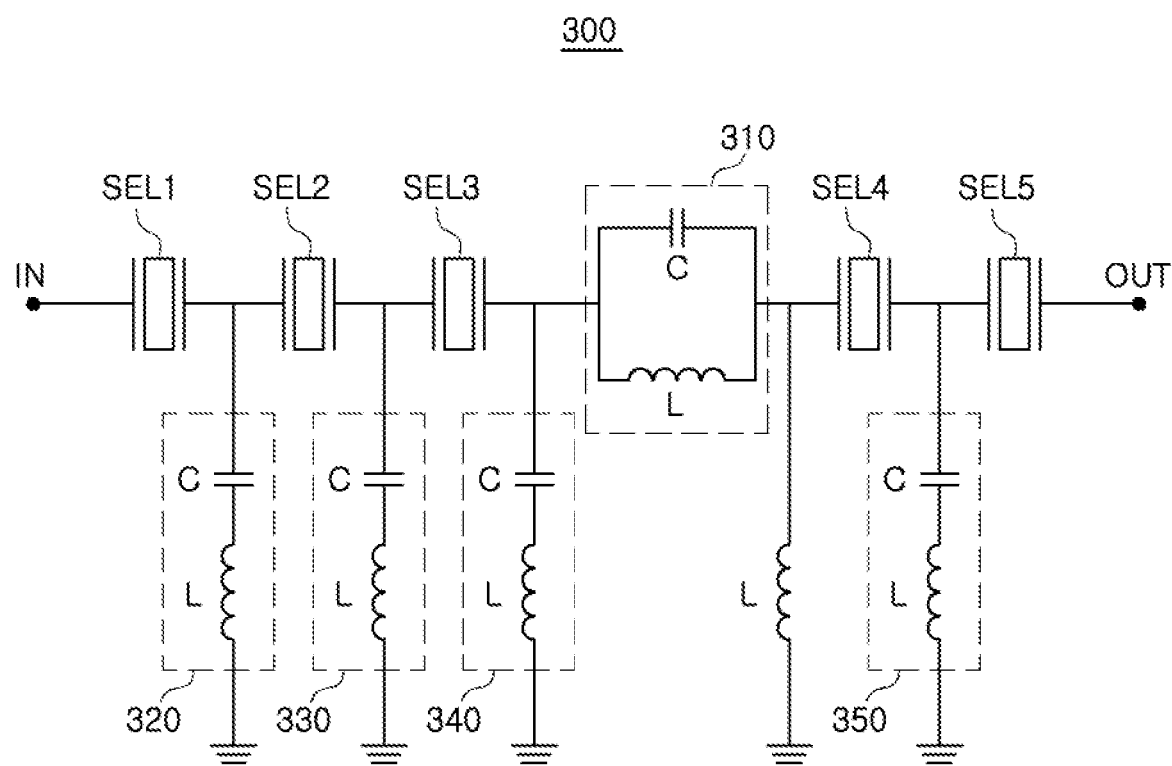
FIG. 8 is a circuit diagram of a second notch filter according to an example.
Figure 9:
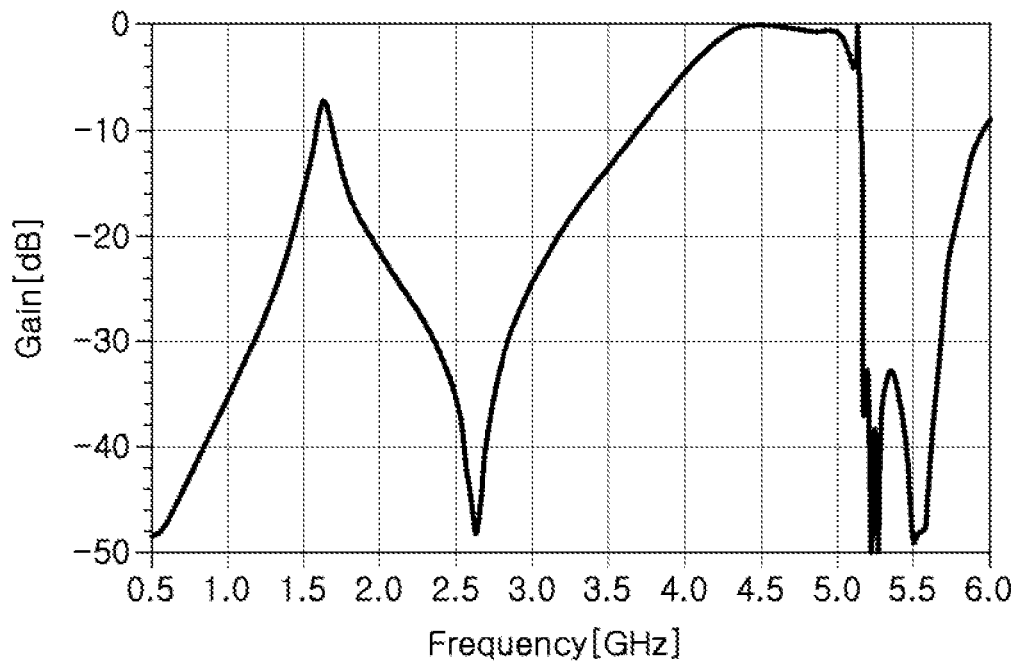
FIG. 9 is a graph illustrating a frequency response obtained by using a second notch filter according to an example.
Figure 10:
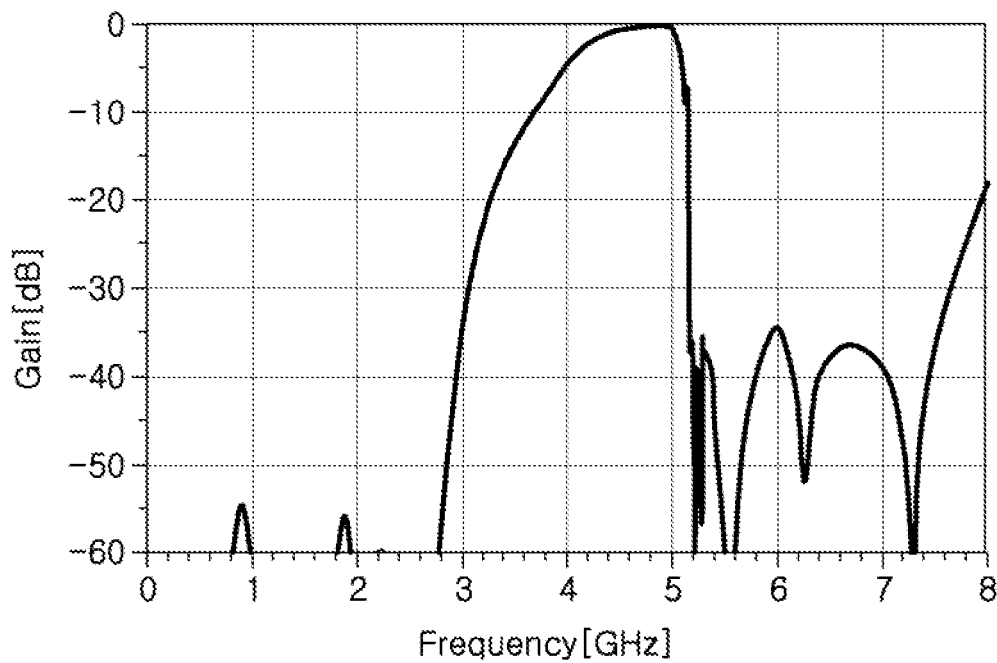
FIG. 10 is a graph illustrating a frequency response obtained by using a combination of a base filter and a second notch filter according to an example.

FIG. 8 is a circuit diagram of a second notch filter, according to an example. FIG. 9 is a graph illustrating a frequency response obtained by using a second notch filter, according to an example. FIG. 10 is a graph illustrating a frequency response obtained by using a combination of a base filter and a second notch filter, according to an example.

Referring to the example of FIG. 8, the second notch filter 300 in the example may include at least one series resonator disposed on a series end between an input terminal IN and an output terminal OUT, and a series LC resonance circuit disposed on a shunt end.

For example, the second notch filter 300 may include a first series resonator SE1, a second series resonator SE2, a third series resonator SE3, a parallel LC resonance circuit 310, a fourth series resonator SE4, and a fifth series resonator SE5, as shown in the example of FIG. 8. However, this is only an example, and different configurations of series resonators may be used in other examples. The second notch filter 300 may further include a first series LC resonance circuit 320 disposed between a node between the first series resonator SE1 and the second series resonator SE2, and a ground, a second series LC resonance circuit 330 disposed between a node between the second series resonator SE2 and the third series resonator SE3, and a ground, a third series LC resonance circuit 340 disposed between a node between the third series resonator SE3 and the parallel LC resonance circuit 310, and a ground, an inductor L disposed between a node between the parallel LC resonance circuit 310 and the fourth series resonator SE4, and a ground, and a fourth series LC resonance circuit 350 between a node between the fourth series resonator SE4 and the fifth series resonator SE5, and a ground.

The parallel LC resonance circuit 310 may include an inductor and a capacitor connected in parallel, and the first series LC resonance circuit 320, the second series LC resonance circuit 330, the third series LC resonance circuit 340, and the fourth series LC resonance circuit 350 each may include an inductor and a capacitor connected in series. Also, alternative configurations are possible in other examples.

Referring to the example of FIG. 9, resonance frequencies of a first series resonator SE1, a second series resonator SE2, a third series resonator SE3, a fourth series resonator SE4, and a fifth series resonator SE5 may be 5.17 GHz, 5.18 GHz, 5.21 GHz, 5.24 GHz, and 5.27 GHz, respectively.

The resonance frequencies of the first series resonator SE1, the second series resonator SE2, the third series resonator SE3, the fourth series resonator SE4, and the fifth series resonator SE5 may form an attenuation band, and may secure attenuation properties at a frequency approximate to a pass band frequency of the band n79, between 4.4 and 5.0 GHz.

Resonance frequencies of two LC resonance circuits among a first series LC resonance circuit 320, a second series LC resonance circuit 330, a third series LC resonance circuit 340, and a fourth series LC resonance circuit 350 may be within 99% and 101% of 5.515 GHz, which may correspond to a center frequency of 5 GHz Wi-Fi communications. A resonance frequency of one of the other LC resonance circuits may be 2.69 GHz, a low band stop frequency, and the other may be 250% of 5.515 GHz, which may correspond to a center frequency of 5 GHz Wi-Fi communications, as indicated above. Also, the parallel LC resonance circuit 310 may be 150% of 5.515 GHz, which may correspond to a center frequency of 5 GHz Wi-Fi communications, as indicated above.

Due to the frequency response of the second notch filter illustrated in the example of FIG. 9, a frequency response of the base filter may be attenuated as the frequency response obtained by using a combination of the base filter and the second notch filter as illustrated in the example of FIG. 10.

The switch 400 may be selectively connected to the second notch filter 300 and a third notch filter 300, and may form a path for a radio frequency signal as a result. For example, the switch 400 may be connected to the first notch filter 200 during an operational period of the first notch filter 200, and the switch 400 may be connected to the second notch filter 300 during an operational period of the second notch filter 300.

According to the aforementioned examples, the front end module in the example embodiment may cover a relatively broad frequency band compared to alternative technologies and may reduce interference between designed channels during operation.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A front end module, comprising:
a base filter configured to operate as a bandpass filter passing a pass band of an input radio frequency signal;
a switch connected to the base filter; and
a first notch filter and a second notch filter selectively connected to the base filter through the switch,
wherein a stop band of the first notch filter and a stop band of the second notch filter overlap the pass band of the base filter in a band equal to or higher than a center frequency of the pass band of the base filter.

2. The front end module of claim 1, wherein the stop band of the first notch filter is the same as the stop band of the second notch filter.

3. The front end module of claim 2, wherein a pass band of a radio frequency signal output from the first notch filter is different from a pass band of a radio frequency signal output from the second notch filter.

4. The front end module of claim 1, wherein the base filter includes at least one parallel LC resonance circuit disposed on a series end between an input terminal and an output terminal, and at least one series LC resonance circuit disposed on a shunt end between the series end and a ground.

5. The front end module of claim 1, wherein the first notch filter includes a parallel LC resonance circuit disposed on a series end between an input terminal and an output terminal.

6. The front end module of claim 1, wherein the second notch filter includes at least one resonator disposed on a series end between an input terminal and an output terminal, and an LC resonance circuit disposed on a shunt end between the series end and a ground.

7. The front end module of claim 6, wherein the at least one resonator includes either one or both of a surface acoustic wave (SAW) resonator and a bulk acoustic wave (BAW) resonator.

8. The front end module of claim 1, wherein a pass band of a radio frequency signal output from the first notch filter is 3.3 to 4.2 GHz and a pass band of a radio frequency signal output from the second notch filter is 4.4 GHz to 5.0 GHz.

9. A front end module, comprising:
a base filter configured to operate as a pass band filter passing a pass band of an input signal;
a switch connected to the base filter; and
a first notch filter and a second notch filter selectively connected to the base filter through the switch,
wherein an amount of attenuation of the first notch filter is different from an amount of attenuation of the second notch filter.

10. The front end module of claim 9, wherein the amount of attenuation of the second notch filter is greater than the amount of attenuation of the first notch filter.

11. The front end module of claim 9, wherein a stop band of the first notch filter and a stop band of the second notch filter overlap the pass band of the base filter.

12. The front end module of claim 9, wherein a stop band of the first notch filter is the same as a stop band of the second notch filter.

13. The front end module of claim 12, wherein a pass band of a radio frequency signal output from the first notch filter is different from a pass band of a radio frequency signal output from the second notch filter.

14. The front end module of claim 9, wherein the base filter includes at least one parallel LC resonance circuit disposed on a series end between an input terminal and an output terminal, and at least one series LC resonance circuit disposed on a shunt end between the series end and a ground.

15. The front end module of claim 9, wherein the first notch filter includes a parallel LC resonance circuit disposed on a series end between an input terminal and an output terminal.

16. The front end module of claim 9, wherein the second notch filter includes at least one resonator disposed on a series end between an input terminal and an output terminal, and an LC resonance circuit disposed on a shunt end between the series end and a ground.

17. The front end module of claim 16, wherein the at least one resonator includes either one or both of a surface acoustic wave (SAW) resonator and a bulk acoustic wave (BAW) resonator.

18. The front end module of claim 9, wherein a pass band of a radio frequency signal output from the first notch filter is 3.3 to 4.2 GHz and a pass band of a radio frequency signal output from the second notch filter is 4.4 GHz to 5.0 GHz.

* * * * *